March 8, 1955 A. A. MACDONALD 2,703,825

ELECTRONIC GAIN CONTROL DEVICE

Filed Feb. 27, 1951

WITNESSES:

E. A. McCloskey.

Wm. T. Wofford

INVENTOR

Angus A. Macdonald.

BY

F. E. Browder

ATTORNEY

United States Patent Office 2,703,825

Patented Mar. 8, 1955

2,703,825

ELECTRONIC GAIN CONTROL DEVICE

Angus A. Macdonald, Catonsville, Md., assignor to Westinghouse Electric Corporation, East Pittsburgh, Pa., a corporation of Pennsylvania Application February 27, 1951, Serial No. 212,969

9 Claims. (Cl. 179—171)

My invention relates to electronic apparatus and in particular to electronic gain control devices.

A particular amplifier tube generally will operate without distortion only within a given range of magnitudes of the input signals. In order to accommodate a relatively wide range of input signal magnitudes without resulting distortion, gain controlled amplifiers have been employed. It is conventional practice, in the prior art of which I am aware, to control the gain of an amplifier by feeding a direct current control voltage, derived from the output circuit of the amplifier, to the grid of the amplifier tube to render it more negative with respect to the cathode, proportionately to the magnitude of the output signal. Thus, as the output signal increases in magnitude, the grid of the amplifier tube is rendered more negative, and the gain of the tube is decreased. In some cases, the aforementioned direct current control voltage is derived from a stage ahead of the amplifier and is amplified by an auxiliary amplifier, rectified, and then applied to the grid of the main amplifier tube, to render it more negative as the magnitude of the input signal increases. A gain control device of the last-mentioned type is described on page 412 of Terman's Radio Engineers Handbook, first edition, 1943. Various other schemes for gain control of amplifiers, also called volume compression, have been employed in the prior art. See, for example, Stewart and Pollock, Compression with Feedback, Electronics, volume 13, page 19, February 1940. In all of the conventional gain control schemes of which I am aware, the direct current control voltage is fed directly onto the grid of the amplifier tube in such a sense as to render the grid more negative with respect to the cathode as the magnitude of the signal voltage increases. Also, all of the conventional gain control schemes operate to reduce the gain of the controlled amplifier as the signal level increases. Further, in such prior art gain control schemes, the signal voltage on the grid of the controlled amplifier varies as the magnitude of the input signal changes.

It is an object of my invention to provide an improved gain control device, which will obviate the disadvantages attending such devices in the prior art.

It is another object of my invention to provide an improved gain control device, which is capable of handling large variations in signal level without resulting distortion.

It is another object of my invention to provide an improved amplifier volume compressor, which is capable of effective operation without reducing the gain of the controlled amplifier.

It is another object of my invention to provide an improved amplifier volume compressor, which will maintain the signal voltage on the grid of the controlled amplifier relatively constant, regardless of variations in the level of the amplifier input signal.

In accordance with my invention, gain control is attained by means of voltage divider action wherein a resistor or impedance which is connected in series with the amplifier tube grid circuit forms one element of the voltage divider, and the grid-cathode impedance of the amplifier tube forms the variable element of the voltage divider. The grid-cathode impedance referred to, is the dynamic conductance associated with electron flow from cathode to grid in the tube. A positive going direct current control voltage is applied to the grid of the amplifier tube either through a fixed series grid impedance, or it may be applied to a diode connected directly to the amplifier tube grid. By positive going direct current control voltage, I mean a direct current control voltage which tends to become more positive as the magnitude of the input signal voltage increases. This direct current control voltage may be derived in any conventional manner, either from a stage following the amplifier or from a stage preceding it. In accordance with another aspect of my invention, dual diodes may be used as the variable element of a voltage divider in a gain control circuit, in which case the control voltage may be either positive or negative going, depending upon the specific circuit used.

The aforementioned and other objects are effected by my invention as will be apparent from the following descrpition and claims taken in accordance with the accompanying drawing, forming a part of this application, in which:

Figure 1:
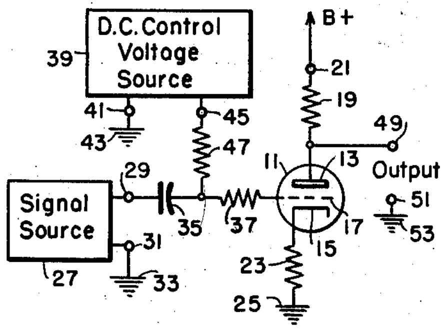
Figure 1 is a schematic diagram showing one embodiment of my invention.

In Fig. 1, there is shown an amplifier tube 11 which may be of any conventional type, having at least an anode 13, a cathode 15, and a control electrode 17. The anode 13 of the amplifier tube 11 is connected through a voltage dropping resistor 19 to the positive terminal 21 of a conventional direct current anode voltage suppply, not shown. The cathode 15 of the amplifier tube 11 is connected through a biasing resistor 23 to ground at 25. An input signal source shown as a block 27 is connected across the input terminals 29, 31 of the amplifier circuit. The signal source may be any conventional source of audio signal energy. Means for deriving such signals are well known in the art, and are therefore not described in detail in the present application. One of the input terminals 31 is connected to ground at 33. The other input terminal 29 is connected in series with a coupling capacitor 35 and a fixed resistor 37 to the control electrode 17, or grid, of the amplifier tube 11. Means for deriving a positive going direct current control voltage is provided. This control voltage may be derived from a stage which is either on the output or the input side of the amplifier tube in any conventional manner, such as is well known in the art. Since the specific means for deriving this control voltage forms no part of the present invention, I have shown it as a block 39. One terminal 41 of the direct current control voltage source is grounded at 43. The other terminal 45 of the control voltage source 39 which is the positive terminal, is connected through a voltage dropping resistor 47 to the junction of the fixed resistor 37 and the coupling capacitor 35. The anode 13 of the amplifier tube 11 is connected to one output terminal 49. The other output terminal 51 is connected to ground at 53.

In the operation of the gain control device shown in Fig. 1, the fixed resistor 37 and the grid-cathode impedance of the amplifier tube 11 form the elements of a voltage divider. The positive going direct current control voltage is applied in series with this voltage divider. As the input signal level increases, the grid-cathode current tends to increase, decreasing the grid-cathode impedance proportionately, so that increasingly more of the input signal is dissipated by the fixed resistor 37. Thus, the signal reaching the grid 17 of the amplifier tube 11 tends to remain relatively constant regardless of large variations in the magnitude of the input signal.

Since a large change in the grid-cathode impedance of the amplifier tube will occur within a relatively small range of grid voltages, the operating grid-cathode signal voltage must be small compared to this range, or distortion will be evident. The initial operating conditions must be set so that the signal applied to the grid of the amplifier tube is never excessive. Once such initial operating conditions are established, the input signal voltage may be increased hundreds of times without causing additional distortion. The above-described circuit may be used with any type of amplifier tube. Lower gain tubes will, however, tolerate larger original input signals.

Figure 2:
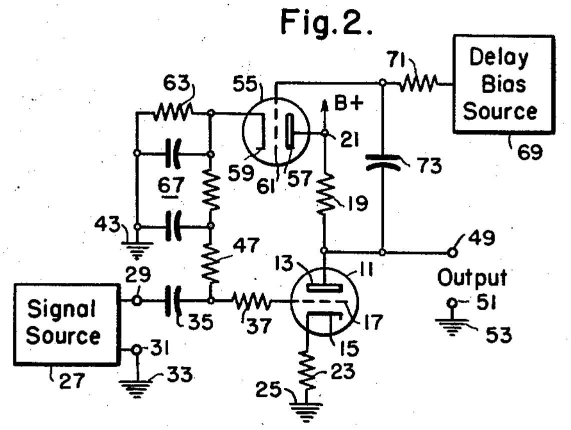
Fig. 2 is a schematic diagram showing a means for deriving a direct current control voltage, as applied to the embodiment shown in Fig. 1.

The circuit shown in Fig. 2 is substantially identical in organization and operation to that shown in Fig. 1 except that a specific means for deriving a positive going direct current control voltage is shown. This means comprises a triode tube 55 having an anode 57, a cathode 59, and a control electrode 61. The anode 57 is connected to the positive terminal 21 of a conventional source of anode voltage, not shown, and through the dropping resistor 19 to the anode of the amplifier tube 11. The cathode 59 of the triode 55 is connected through a load resistor 63 to ground at 43. The output of the triode 55 is taken from the load resistor 63 through a smoothing network 67, and is applied through the voltage dropping resistor 47 to the common terminal of the fixed resistor 37 and the coupling capacitor 35. A conventional delay bias source shown as a block 69 is connected through a bias resistor 71 to the control electrode 61 of the triode 55. The delay bias may be adjusted to render the triode 55 operative at the desired signal level. The anode 13 of the amplifier tube 11 is connected through a coupling capacitor 73 to the control electrode 61 of the triode 55. Thus, a positive going direct current control voltage, the magnitude of which is a function of the magnitude of the output signal level, is derived.

Figure 3:
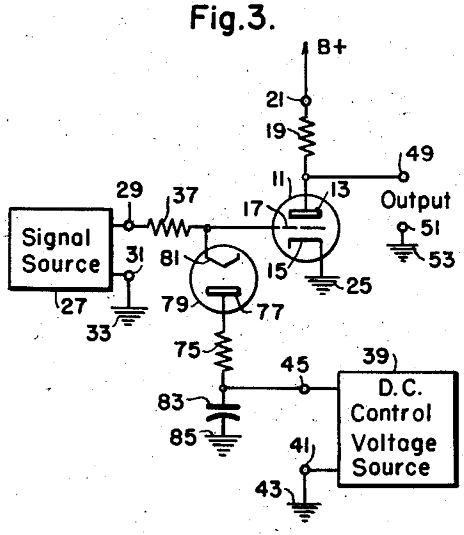
Fig. 3 is a schematic diagram of another embodiment of my invention.

The linearity of the variable impedance element of the voltage divider is increased by the addition of a diode in the amplifier grid-cathode circuit. This arrangement which is shown in Fig. 3, allows a larger input signal to be used for a given amount of distortion. The connections and elements shown in Fig. 3 are substantially the same as those shown in Fig. 1 except that the positive terminal 45 of the direct current control voltage source 39 is connected in series with a resistor 75 to the anode 77 of a diode 79, the cathode 81 of which is connected directly to the grid 17 of the amplifier tube 11. Also, a by-pass capacitor 83 is connected between the positive terminal 45 of the control voltage source 39 and ground at 85. The resistor 75 in series with the diode 79 is necessary to obtain the above-mentioned improved linearity, due to the dissimilarity of the dynamic conductances of the diode 79 and the grid-cathode circuit of the amplifier tube 11. The operation of the arrangement shown in Fig. 3 is substantially the same as that described above in connection with Fig. 1.

Figure 4:
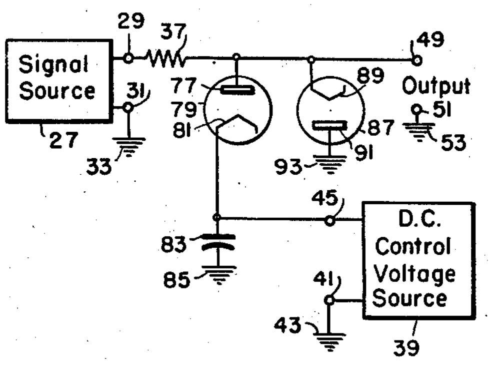
Fig. 4 is a schematic diagram of a further embodiment of my invention.

A further embodiment of my invention is schematically shown in Fig. 4. In this embodiment, a pair of diodes 79, 87 are utilized as the variable element of the voltage divider. One terminal 31 of the signal source 27 is grounded at 33, and the other terminal 29 is connected through the fixed impedance element 37 of the voltage divider to one output terminal 49 which is common to the anode 77 of the first diode 79 and the cathode 89 of the second diode 87. The other ouput terminal 51 is connected to ground at 53. The anode 91 of the second diode 87 is connected to ground at 93. One terminal 41 of the direct current control voltage source 39 is connected to ground at 43, and the other terminal 45 is connected to the cathode 81 of the first diode 79. The cathode 81 of the first diode 79 is also connected through a by-pass capacitor 83 to ground at 85. The arrangement of Fig. 4 results in good linearity and allows the application of a relatively large input signal for a given amount of distortion. In Fig. 4, it is assumed that the dynamic conductances of the diodes 79, 87 are identical, and therefore no series resistance is needed. The operation of the embodiment shown in Fig. 4 is substantially the same as that which was described above in connection with Figs. 1 and 3, except that the control voltage is negative going.

In actual practice, I have found that the distortion due to the gain control action does not exceed approximately 2% at any point in the range, and is normally considerably less. Less distortion is incurred, of course, if the circuits are operated at low signal levels, or if lower gain tubes are used.

It will be noted from the foregoing that the direct current control signal which I feed into the amplifier grid circuit is of polarity opposite to that of the direct current control signal usually employed in amplifier gain control arrangements. Also, it should be mentioned that the gain of an amplifier controlled in accordance with my invention is not reduced, but it is actually slightly increased. Also, the gain control circuits of my invention maintain the signal voltage on the grid of the controlled amplifier relatively constant regardless of the signal input level. Each of the characteristics aforementioned is the exact opposite of the action involved in the conventional amplifier gain control arrangements of the prior art. It should be further noted that in cases where two diodes are used, the control voltage may be either positive or negative going, depending upon the specific circuit used. Various means of obtaining delay bias and the proper connections, therefor, will occur to those skilled in the art. In the embodiment shown in Fig. 4, the delay bias means is incorporated in the control voltage source.

While I have shown my invention in several forms, it will be obvious to those skilled in the art that it is not so limited, but is susceptible of various changes and modifications without departing from the spirit thereof.

I claim as my invention:

1. A gain control device comprising in combination, input terminals adapted for connection to a signal source, means for deriving a positive going direct current control voltage the magnitude of which increases as the magnitude of the input signal voltage increases, a voltage divider network having as a first element an electronic discharge path connected in series with said input terminals, and having as a second element, a fixed impedance, also connected in series with said input terminals, output terminals connected in series with said first element, and means for applying said direct current control voltage in series with said network.

2. A gain control device comprising in combination, input terminals adapted for connection to a signal source, means for deriving a positive going direct current control voltage the magnitude of which increases as the magnitude of the input signal voltage increases, an electron discharge device having an anode, a cathode, and a control electrode, output terminals connected in series with said cathode and said anode, means for connecting said control electrode and cathode in series with said input terminals, a resistance connected to said control electrode and in series with said input terminals, and means for applying said control voltage across a series circuit comprising said resistor, said control electrode and said cathode, the relationship between said control voltage, said discharge device and said input signal being such that the gain of said discharge device remains substantially constant for all variations in the input signal.

3. A gain control device comprising in combination, input terminals adapted for connection to a signal source, means for deriving a positive going direct current control voltage the magnitude of which increases as the magnitude of the input signal voltage increases, an electron discharge device having an anode, a cathode, and a control electrode, means for connecting said control electrode and cathode in series with said input terminals, an electronic discharge path having a first terminal connected to said control electrode and a second terminal, output terminals connected in series with said anode and cathode, and means for applying said control voltage in series with said second terminal and said cathode.

4. A gain control device comprising in combination, input terminals adapted for connection to a signal source, an electron discharge device having an anode, a cathode, and a control electrode, output terminals connected in series with said anode and cathode, a resistance connected in series with said input terminals, said cathode and said control electrode and having a terminal connected to said control electrode, means connected in the output circuit of said discharge device for deriving a positive going direct current control voltage the magnitude of which increases as the magnitude of the output signal voltage increases, and means for applying said control voltage in a series circuit comprising said resistance, said control electrode and said cathode, the relationship between said control voltage, said discharge device and said signal source being such that the gain of said discharge device remains substantially constant for all variations in the signal source.

5. A gain control device comprising in combination, first and second input terminals adapted for connection to a source of audio signal energy, an amplifier tube having an anode, a cathode, and a control electrode, means for deriving a positive going direct current control voltage the magnitude of which increases as the magnitude of the input signal increases, a resistor having first and second terminals, a conductor connecting the second terminal of said resistor to said control electrode, means connecting said first terminal of said resistor to the first input terminal, means connecting said cathode to said second input terminal, output terminals connected in series with said anode and cathode, and means for applying said direct current control voltage across the first terminal of said resistor and said cathode, the relationship between said amplifier tube, said control voltage and the audio signal energy being such that the gain of said amplifier tube remains substantially constant for all variations in said audio signal energy.

6. In a gain control device, an amplifier tube, means for applying an input signal to said amplifier, an impedance traversed by the input signal, means for deriving a positive going direct current control voltage the magnitude of which increases as the magnitude of the input signal increases, and means for applying said control voltage to said impedance and the grid-cathode circuit of said amplifier, in a sense such that said impedance and the grid-cathode impedance of the amplifier form a voltage divider of which the said grid-cathode impedance is a variable element, whereby the signal voltage on the grid of said amplifier is maintained relatively constant, regardless of variations in the input signal level.

7. In a gain control device, an amplifier tube, a diode, a fixed impedance, means for applying an input signal in series with said impedance to the grid of said amplifier, means for deriving a positive going direct current control voltage the magnitude of which increases as the magnitude of the input signal increases, and means for applying said control voltage through said diode to the grid of said amplifier, in a sense such that the signal voltage on the grid of said amplifier is maintained relatively constant, regardless of variations in the input signal level.

8. A gain control circuit utilizing a voltage divider comprising an impedance and an electron discharge path, means for applying an input signal in series with said voltage divider, means for deriving a positive going direct current control voltage which varies in direct proportion to the input signal, and means for applying said control voltage to said voltage divider in a manner such that the impedance of said discharge path will vary inversely with variations in the amplitude of said input signal.

9. A gain control device comprising in combination, input terminals adapted for connection to a signal source, means for deriving a direct current control voltage the magnitude of which varies in direct proportion with the magnitude of the input signal voltage, an electronic discharge device having a grid and cathode included therein, a voltage divider network connected in series with said input terminals and including as elements a fixed impedance and the grid-cathode impedance of said discharge device, output terminals connected to said electronic discharge device, and means for applying said direct current control voltage to said network, said means for deriving a direct current control voltage, the electronic discharge device, and said network being of such nature and relationship as to constitute means for decreasing said grid-cathode impedance as the input signal amplitude increases to thereby maintain the gain of said discharge device substantially constant for all variations in input signal amplitude.

References Cited in the file of this patent

UNITED STATES PATENTS

| | | |
|---|---|---|
| 2,200,049 | Van Loon | May 7, 1940 |
| 2,503,996 | Broos | Apr. 11, 1950 |
| 2,559,038 | Bass | July 3, 1951 |